United States Patent
Kim et al.

(10) Patent No.: US 10,367,490 B2
(45) Date of Patent: Jul. 30, 2019

(54) ELECTRONIC CIRCUITS FOR OUTPUTTING POST EMPHASIS SIGNALS

(71) Applicant: Samsung Electronics Co., Ltd., Suwon-si, Gyeonggi-do (KR)

(72) Inventors: Wangsoo Kim, Seoul (KR); Hangi Jung, Hwaseong-si (KR); Kiduk Park, Seoul (KR); Yoo-Chang Sung, Hwaseong-si (KR); Jae-Hun Jung, Seoul (KR); Cheongryong Cho, Yongin-si (KR); Hun-Dae Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/026,145

(22) Filed: Jul. 3, 2018

(65) Prior Publication Data

US 2019/0140628 A1 May 9, 2019

(30) Foreign Application Priority Data

Nov. 6, 2017 (KR) .......... 10-2017-0146810

(51) Int. Cl.
*H03K 5/13* (2014.01)
*H04B 1/04* (2006.01)
*H03K 5/00* (2006.01)

(52) U.S. Cl.
CPC ..... *H03K 5/13* (2013.01); *H03K 2005/00019* (2013.01); *H04B 1/04* (2013.01)

(58) Field of Classification Search
None
See application file for complete search history.

(56) References Cited

U.S. PATENT DOCUMENTS

| | | | |
|---|---|---|---|
| 6,549,036 B1 | 4/2003 | Lee | |
| 7,545,860 B2 | 6/2009 | Gorecki | |
| 7,940,839 B2 | 5/2011 | Lapointe et al. | |
| 8,030,968 B1 | 10/2011 | Avner et al. | |
| 8,254,491 B2 | 8/2012 | Dally | |
| 8,710,918 B2 * | 4/2014 | Uemura | H04L 25/028 327/551 |
| 9,450,744 B2 | 9/2016 | Simpson et al. | |
| 9,589,627 B1 | 3/2017 | Wilson et al. | |
| 9,653,147 B1 | 5/2017 | Wang et al. | |
| 2013/0322506 A1 | 12/2013 | Zerbe et al. | |
| 2017/0118048 A1 | 4/2017 | Ulrich | |
| 2018/0123593 A1 * | 5/2018 | Choi | G11C 29/028 |

* cited by examiner

*Primary Examiner* — Cassandra F Cox
(74) *Attorney, Agent, or Firm* — Myers Bigel, P.A.

(57) ABSTRACT

An electronic circuit may include a driver, a delay circuit, a strength control circuit, and an adder circuit. The driver may generate a second signal based on a first signal. The delay circuit may delay the first signal by as much as a reference time, to generate a third signal. The strength control circuit may adjust an amplitude of the third signal to generate a fourth signal. The adder circuit may add the second signal and the fourth signal to generate a fifth signal. In a first time interval determined based on the reference time, an amplitude of the fifth signal may be greater than an amplitude of the second signal. In a second time interval except for the first time interval, the amplitude of the fifth signal may be smaller than the amplitude of the second signal. In the second time interval, the amplitude of the fifth signal may be smaller than an amplitude of the first signal.

20 Claims, 9 Drawing Sheets

ELECTRONIC CIRCUITS FOR OUTPUTTING POST EMPHASIS SIGNALS

CROSS-REFERENCE TO RELATED APPLICATIONS

This application claims priority under 35 U.S.C. § 119 to Korean Patent Application No. 10-2017-0146810 filed Nov. 6, 2017, in the Korean Intellectual Property Office, the entire contents of which are incorporated by reference herein for all purposes.

TECHNICAL FIELD

Aspects of the present disclosure relate to an electronic circuit, and more particularly, relate to an electronic circuit used to transmit a signal.

BACKGROUND

As information devices such as computers, mobile phones, and smartphones are further developed and improved, large amounts of information are being stored and processed by the information devices. Accordingly, memory devices having higher performance are being desired as components of information devices. Since in some devices a memory semiconductor can operate with low power, such memory semiconductors are being used in memory devices. The memory semiconductors may include a random access memory (RAM), a read only memory (ROM), or the like. The RAM may include a static RAM (SRAM), a dynamic RAM (DRAM), or the like.

As high-capacity, high-speed, and low-power technologies of the memory device are developed, technology for exactly or correctly transmitting a signal within an information device is desired. An information processing device such as a central processing unit (CPU) or an application processor (AP) may exchange various signals with memory devices. To process information quickly, the information processing device simultaneously or concurrently exchanges various signals with memory devices.

When signals are transmitted within an information device, included when signals are transmitted simultaneously or concurrently, interference may be generated between the signals. If the interference is generated in a signal transmission process, the waveform of the signal may become distorted. In cases where the waveform of the signal is distorted, information that the signal indicates may also become also distorted. Accordingly, there is a desire for technology to compensate for distortion of a waveform upon transmitting a signal, so that components of the information device can exchange information exactly or correctly with each other.

SUMMARY

Aspects of the present disclosure provide electronic circuits configured to output emphasis signals, for the purpose of attenuating distortion of a signal waveform.

For example, according to an example aspect, an electronic device may be provided. The electronic device may include a driver, a delay circuit, a strength control circuit, and an adder circuit. The driver may generate a second signal based on a first signal. The delay circuit may delay the first signal by as much as a reference time, to generate a third signal. The strength control circuit may adjust an amplitude of the third signal to generate a fourth signal. The adder circuit may add the second signal and the fourth signal to generate a fifth signal. In a first time interval determined based on the reference time, an amplitude of the fifth signal may be greater than an amplitude of the second signal. In a second time interval except for the first time interval, the amplitude of the fifth signal may be smaller than the amplitude of the second signal. In the second time interval, the amplitude of the fifth signal may be smaller than an amplitude of the first signal.

According to an example aspect, an electronic device is provided. The electronic device may include a driver configured to generate a second signal, an amplitude of which is smaller than an amplitude of a first signal; a delay circuit configured to delay the first signal by a reference time, to generate a third signal; a strength control circuit configured to generate a fourth signal including an emphasis component, an amplitude of which is determined based on an amplitude of the third signal; and an adder circuit configured to add the second signal and the fourth signal to generate a fifth signal. In a first time interval determined based on the reference time, an amplitude of the fifth signal may correspond to the amplitude of the first signal, and in a second time interval different from the first time interval, the amplitude of the fifth signal may be smaller than the amplitude of the first signal.

According to an example aspect. an electronic device is provided. The electronic device may include a driver configured to generate a second signal, an amplitude of which is smaller than an amplitude of a first signal; a delay circuit configured to delay the first signal by a reference time, to generate a third signal; a strength control circuit configured to generate a fourth signal including an emphasis component, an amplitude of which is determined based on an amplitude of the third signal; and an adder circuit configured to add the second signal and the fourth signal to generate a fifth signal. In a first time interval determined based on the reference time, an amplitude of the fifth signal may correspond to the amplitude of the first signal, and in a second time interval different from the first time interval, the amplitude of the fifth signal may be smaller than the amplitude of the first signal.

BRIEF DESCRIPTION OF THE FIGURES

The above and other aspects of the present disclosure will become apparent by describing in detail example embodiments thereof with reference to the accompanying drawings.

DETAILED DESCRIPTION

Advantages and features of the present inventive concepts may be understood more readily by reference to the following detailed description of example embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the inventive concepts to those skilled in the art, and the scope of the present application is defined by the appended claims.

Figure 1:
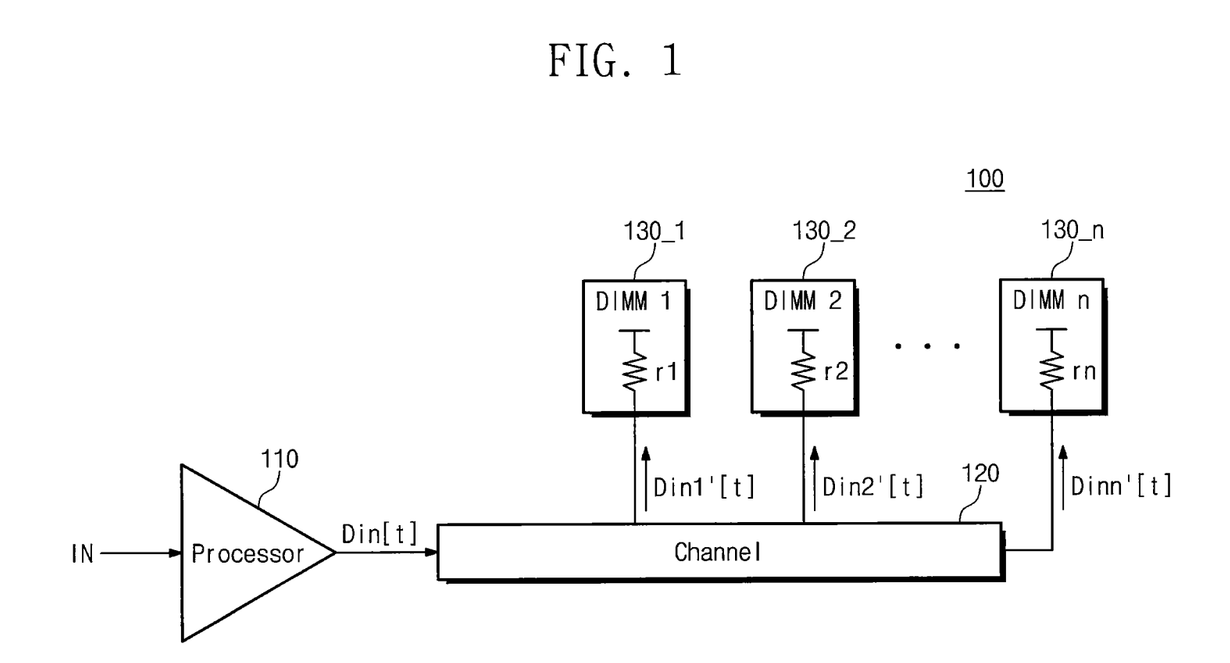
FIG. 1 is a conceptual diagram illustrating an example of configuration for transmitting a signal within an electronic device.

FIG. 1 is a conceptual diagram illustrating an example of configuration for transmitting a signal within an electronic device. Referring to FIG. 1, an electronic device 100 may include a processor 110, a channel 120, and a first dual in-line memory module (DIMM) 130_1 to an n-th DIMM 130_n. The first DIMM 130_1 to the n-th DIMM 130_n may include a first internal resistor r1 to an n-th internal resistor rn, respectively.

For example, each DIMM 130_n may be a memory module including one or more memory chips (not illustrated). Each DIMM 130_n may include a memory controller (not illustrated) for controlling the one or more memory chips. Each DIMM 130_n may store or output data through communication with the processor 110. Alternatively, each DIMM 130_n may store or output data through communication with components of an electronic device (e.g., the electronic device 1000 illustrated in FIG. 10).

The channel 120 may include a conductive material for transferring signals. For example, the channel 120 may include a wire, a printed circuit pattern, a metal trace, and the like. The channel 120 may include one or more buffers for transferring signals.

The channel 120 may have a channel resistor (not illustrated). The channel resistor and the internal resistors r1 to rn of the first to n-th DIMMs 130_1 to 130_n may be matched with a specific magnitude. For example, in the case where the channel resistor is 50 ohms (Ω), the internal resistors r1 to rn of the first to n-th DIMMs 130_1 to 130_n may be matched with 50Ω. However, in practice, the channel resistor may not be completely equally matched with the internal resistors r1 to rn of the first to n-th DIMMs 130_1 to 130_n.

The processor 110 may be a central control device may process operations needed to operate an electronic device or the like. The processor 110 may include a single processor core or may include a plurality of processor cores. For example, the processor 110 may include a dedicated circuit (e.g., field programmable gate arrays (FPGA) or application specific integrated circuits (ASICs)) or a system on chip (SoC), which includes one or more processor cores. For example, the processor 110 may be a general-purpose processor, a workstation processor, an application processor, and/or the like (e.g., the processor 110 may be a component of an electronic device such as the electronic device 1000 illustrated in FIG. 10).

The processor 110 may operate based on a clock. The processor 110 may receive an input signal IN based on the clock. The processor 110 may process information based on the input signal IN. The processor 110 may output a signal Din[t] associated with the processed information to the channel 120 based on the clock. The signal Din[t] may indicate data. The first to n-th DIMMs 130_1 to 130_n may receive each of signals Din1'[t] to Dinn'[t] from the channel 120.

Each of the signals Din1'[t] to Dinn'[t] may correspond to the signal Din[t]. The signal Din[t] may be distorted by various factors while the signal Din[t] is transmitted through the channel 120. For example, a reflected wave associated with the signal Din[t] may be generated due to incomplete matching between the channel resistor and the internal resistors r1 to rn of the first to n-th DIMMs 130_1 to 130_n. The signal Din[t] may cause interference with the reflected wave. Accordingly, the signal Din[t] may have one or more distorted waveforms. Below, the signal Din[t] and any signal (below, Din'[t]) among the signals Din1'[t] to Dinn'[t] will be described with reference to FIG. 2.

Figure 2:
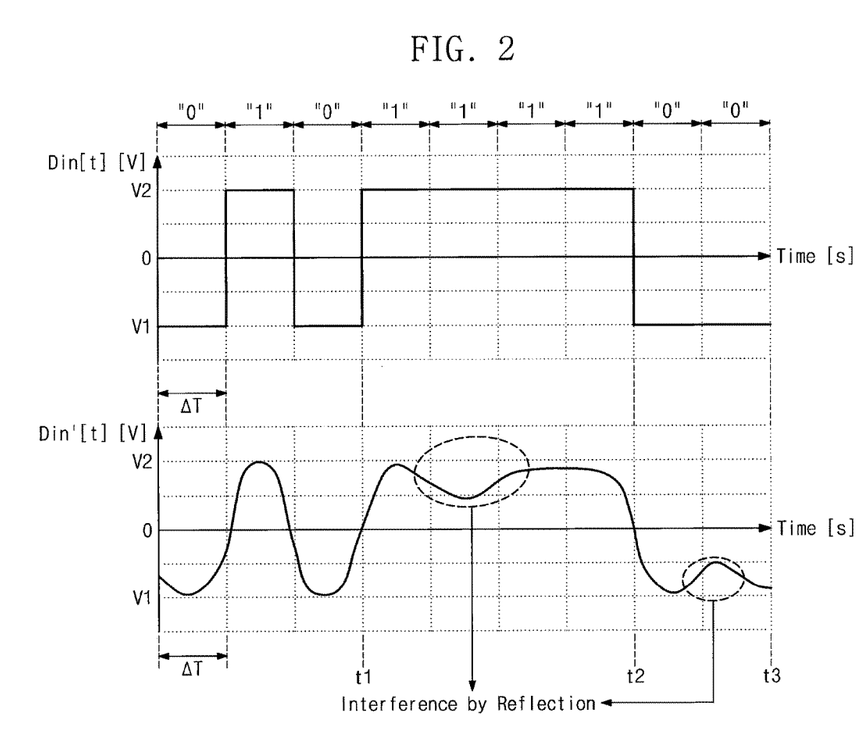
FIG. 2 is a graph indicating examples of signals that are output to a channel of FIG. 1 and are received from the channel of FIG. 1.

FIG. 2 is a graph indicating examples of signals that are output to a channel of FIG. 1 and are received from the channel of FIG. 1. In an example of FIG. 2, an x-axis represents a time of a [s] unit (e.g., seconds, multiples of seconds, or fractions of seconds). A Y-axis represents amplitudes of signals of a [V] unit (e.g., Volts, multiples of Volts, or fractions of Volts). The signal Din[t] of FIG. 2 may be the signal Din[t] of FIG. 1. The signal Din'[t] of FIG. 2 may be one of the signals Din1'[t] to Dinn'[t] of FIG. 1.

As described with reference to FIG. 1, in a process where the signal Din[t] is transmitted through the channel 120 of FIG. 1, the signal Din[t] may cause interference with, or be interfered with, a reflected wave associated with the signal Din[t]. The signal Din'[t], which may have a waveform distorted by the interference, may be received by one of the first DIMM 130_1 to the n-th DIMM 130_n of FIG. 1 (briefly referred to with reference to FIG. 2 as the "DIMM" or "the receiving DIMM"). The signal Din'[t] may have a distorted waveform between a time t1 and a time t2. Also, the signal Din'[t] may have a distorted waveform between the time t2 and a time t3.

As described with reference to FIG. 1, the processor 110 may output the signal Din[t] indicating data based on a clock. In the example of FIG. 2, a time ΔT may be substantially the same as a period of the clock. Accordingly, the signal Din[t] may indicate specific data for each interval corresponding to the time ΔT. For example, the signal Din[t] may indicate unit data (e.g., 1-bit data) for each interval corresponding to the time ΔT.

With regard to the amplitude of the signal Din[t], "V1" may indicate data "0", and "V2" may indicate data "1". In the example of FIG. 2, in an interval before a time t1, data of the signal Din[t] may be "010". In an interval between the time t1 and a time t2, data of the signal Din[t] may be "1111". In an interval between the time t2 and a time t3, data of the signal Din[t] may be "00".

The receiving DIMM may obtain data of the signal Din[t] from the signal Din'[t] corresponding to the signal Din[t]. Accordingly, as the signal Din'[t] includes distorted waveforms, the receiving DIMM may obtain distorted data from the signal Din'[t]. As described with reference to FIG. 1, the signal Din'[t] may include a waveform distorted by a reflected wave. For example, the signal Din'[t] may include distorted waveforms in a low frequency interval.

Herein, a high frequency interval may mean that a data value toggles in units of one bit, e.g., that the data value changes between a first ΔT and an immediately subsequent ΔT. Herein, a low frequency interval may mean that a data value is maintained equally, or that the data value is the same for different ΔT of the interval.

For example, since data that the signal Din[t] indicates in an interval before the time t1 are "010" (e.g., since data indicated by the signal Din[t] toggles from low-to-high and from high-to-low), the interval before the time t1 may be a high frequency interval. Since data that the signal Din[t] indicates in an interval between the time t1 and the time t2 are "1111" (e.g., since data indicated by the signal Din[t] is held or maintained at "1" during the interval between the time t1 and the time t2), the interval between the time t1 and the time t2 may be a low frequency interval. Since data that the signal Din[t] indicates in an interval between the time t2 and the time t3 are "00" (e.g., since data indicated by the signal Din[t] is maintained or held at "0" during the interval between the time t2 and the time t3), the interval between the time t2 and the time t3 may be a low frequency interval. Herein, data that the interval between the time t1 and the time t2 and the interval between the time t2 and the time t3 indicate will be more fully described.

The amplitude of a signal for indicating data that toggles may change. For example, the amplitude of the signal Din[t] before the time t1 may change between V1 to V2. The amplitude of a signal for indicating data that is maintained at a value may be maintained uniformly. For example, the amplitude of the signal Din[t] between the time t1 and the time t2 may be maintained uniformly at V2. The reflected wave described in FIG. 1 may include a varying signal component. Compared with a varying signal, a signal that maintains a uniform amplitude may be significantly affected by the reflected wave. Accordingly, distortion of a waveform generated in a low frequency interval may be greater than distortion of a waveform generated in a high frequency interval. In some embodiments, including some embodiments described herein, amplitude may refer to the absolute value of a difference between a signal value and a reference value. For example, the reference value may be 0, and signal values (e.g., V1 or V2) may be greater than or less than this reference value (e.g., V1 may be greater than zero and V2 may be less than zero). An amplitude of a signal at V1 may be equal to an amplitude of a signal at V2, but the present disclosure is not limited thereto.

For example, in the interval between the time t1 and the time t2, the signal Din'[t] may include a first waveform distorted by the reflected wave. Between the time t1 and the time t2, the DIMM may obtain data "1011" from the signal Din'[t] having the distorted waveform. As another example, in the interval between the time t2 and the time t3, the signal Din'[t] may include a second waveform distorted by the reflected wave. Between the time t2 and the time t3, the DIMM may obtain data "01" from the signal Din'[t] having the distorted waveform.

Figure 3:
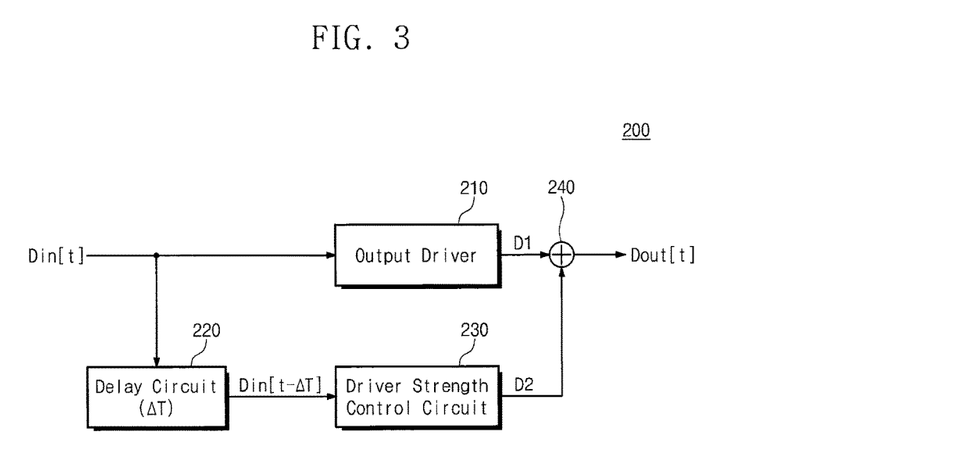
FIG. 3 is a block diagram illustrating an emphasis signal generating circuit according to aspects of the present disclosure.

FIG. 3 is a block diagram illustrating an emphasis signal generating circuit according to aspects of the present disclosure.

Referring to FIG. 3, an emphasis signal generating circuit 200 may include an output driver 210, a delay circuit 220, a driver strength control circuit 230, and an adder circuit 240. In some embodiments, an emphasis signal generating circuit 200 may be included in each of the processor 110 and/or in each of the first DIMM 130_1 to the n-th DIMM 130_n of FIG. 1. For example, each of components constituting an electronic device (e.g., the electronic device 1000 of FIG. 10) may include the emphasis signal generating circuit 200 of FIG. 3 for the purpose of transmitting a signal.

The emphasis signal generating circuit 200 may receive a clock from an external clock generator (not illustrated) or the like. The clock may have a period ΔT. The signal Din[t] input to the emphasis signal generating circuit 200 (which may be the signal Din[t] discussed with reference to FIG. 2) may have substantially the same period ΔT as the period ΔT of the clock. Components of the emphasis signal generating circuit 200 may operate based on the received clock. Accordingly, a signal Dout[t] output from the emphasis signal generating circuit 200 may have substantially the same period ΔT as the period ΔT of the clock.

The output driver 210 may receive the signal Din[t]. The output driver 210 may generate a signal D1 having an amplitude corresponding to the amplitude of the signal Din[t], based on the signal Din[t]. For example, the output driver 210 may adjust the amplitude of the signal Din[t]. The output driver 210 may output the signal D1 having the adjusted amplitude to the adder circuit 240.

The delay circuit 220 may receive the signal Din[t]. The delay circuit 220 may delay the signal Din[t] by as much as a reference time. The reference time may be associated with the period ΔT of the clock. For example, the reference time may be substantially the same as the clock period ΔT. Alternatively, the reference time may be substantially the same as a plurality of periods of the clock. Herein, for convenience of description, examples in which the reference time is substantially the same as the clock period ΔT are described. In the example of FIG. 3, the delay circuit 220 may output a signal Din[t−ΔT] delayed by the time ΔT to the driver strength control circuit 230.

The driver strength control circuit 230 may receive the signal Din[t−ΔT] from the delay circuit 220. The driver strength control circuit 230 may generate a signal D2 for emphasizing the signal Din[t], based on the signal Din[t−ΔT]. Emphasizing a signal, as used herein, may include transforming a waveform of a signal, for the purpose of preventing the signal waveform from being distorted in a signal transmission process.

The driver strength control circuit 230 may adjust the amplitude of the signal Din[t−ΔT] to generate the signal D2. For example, the driver strength control circuit 230 may generate an emphasis component for emphasizing the signal Din[t] by using the signal Din[t−ΔT] received from the delay circuit 220. The driver strength control circuit 230 may generate the signal D2 including the emphasis component. The driver strength control circuit 230 may output the signal D2 to the adder circuit 240. The amplitude of the signal D2 may be based on a gain of the driver strength control circuit 230. A detailed method for emphasizing the signal Din[t] will be described with reference to FIGS. 4, 5, 7, and 8.

The adder circuit 240 may receive the signal D1 and the signal D2 from the output driver 210 and the driver strength control circuit 230, respectively. The adder circuit 240 may add the signal D1 received from the output driver 210 and the signal D2 received from the driver strength control circuit 230. The adder circuit 240 may generate a signal Dout[t] as a result of adding the received signals D1 and D2. The adder circuit 240 may output the signal Dout[t]. A relationship between the signal Dout[t] and the signals D1 and D2 will be described with reference to the following equation 1.

$$Dout[t]=D1+D2 \qquad (1)$$

The signal Dout[t] may be a signal emphasized by the emphasis signal generating circuit 200. For example, the processor 110 of FIG. 1 may output the signal Dout[t] to the channel 120 instead of the signal Din[t]. For example, each of components of an electronic device (e.g., the electronic device 1000 of FIG. 10) may output the signal Dout[t] for transmitting information.

Figure 4:
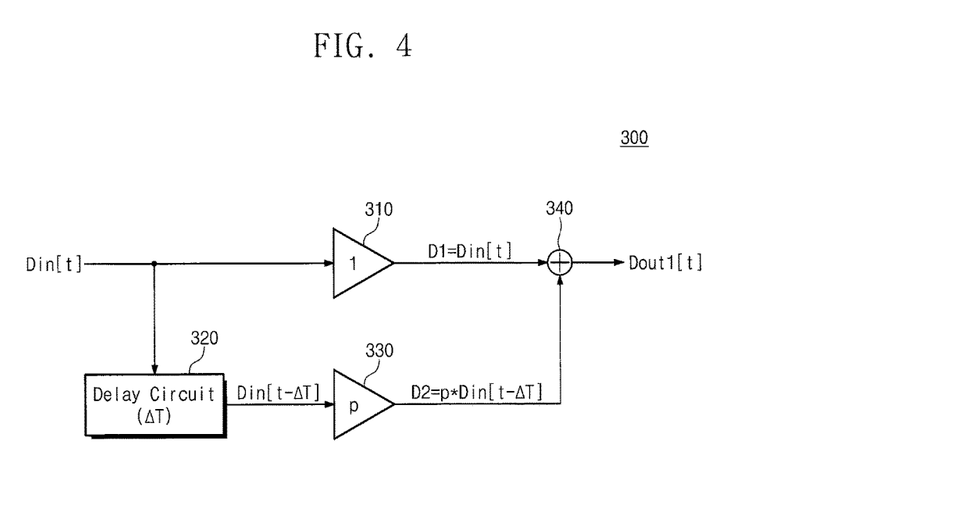
FIG. 4 is a block diagram illustrating the emphasis signal generating circuit according to aspects of the present disclosure.

FIG. 4 is a block diagram illustrating an emphasis signal generating circuit according to aspects of the present disclosure. The emphasis signal generating circuit 200 of FIG. 3 may include an emphasis signal generating circuit 300 of FIG. 4. An operation of a delay circuit 320 is similar to the operation of the delay circuit 220 of FIG. 3, and thus, a description thereof will not be repeated here.

An output driver 310 may receive the signal Din[t]. The output driver 310 may output a signal D1 based on the signal Din[t]. In the example of FIG. 4, the signal D1 may be substantially the same as the signal Din[t]. The output driver 310 may output the signal D1 to an adder circuit 340.

A driver strength control circuit 330 may receive a delayed signal Din[t−ΔT] from the delay circuit 320. The driver strength control circuit 330 may output a signal D2 based on the signal Din[t−ΔT]. For example, a gain of the driver strength control circuit 330 may be "p". The signal D2 may be a signal p*Din[t−ΔT] obtained by amplifying the signal Din[t−ΔT] by "p" times (here, "p" being a positive number). The driver strength control circuit 330 may output the signal D2 to the adder circuit 340.

The adder circuit 340 may receive the signal D1 from the output driver 310. The adder circuit 340 may receive the signal D2 from the driver strength control circuit 330. The adder circuit 340 may add the signal D1 and the signal D2 to output a signal Dout1[t]. The signal Dout1[t] may be expressed by the following equation 2.

$$Dout1[t]=Din[t]+p*Din[t-\Delta T] \quad (2)$$

The processor 110 of FIG. 1 may output the signal Dout1[t] to the channel 120 instead of the signal Din[t]. Each of components of an electronic device (e.g., the electronic device 1000 of FIG. 10) may output the signal Dout1[t] for transmitting information.

Figure 5:
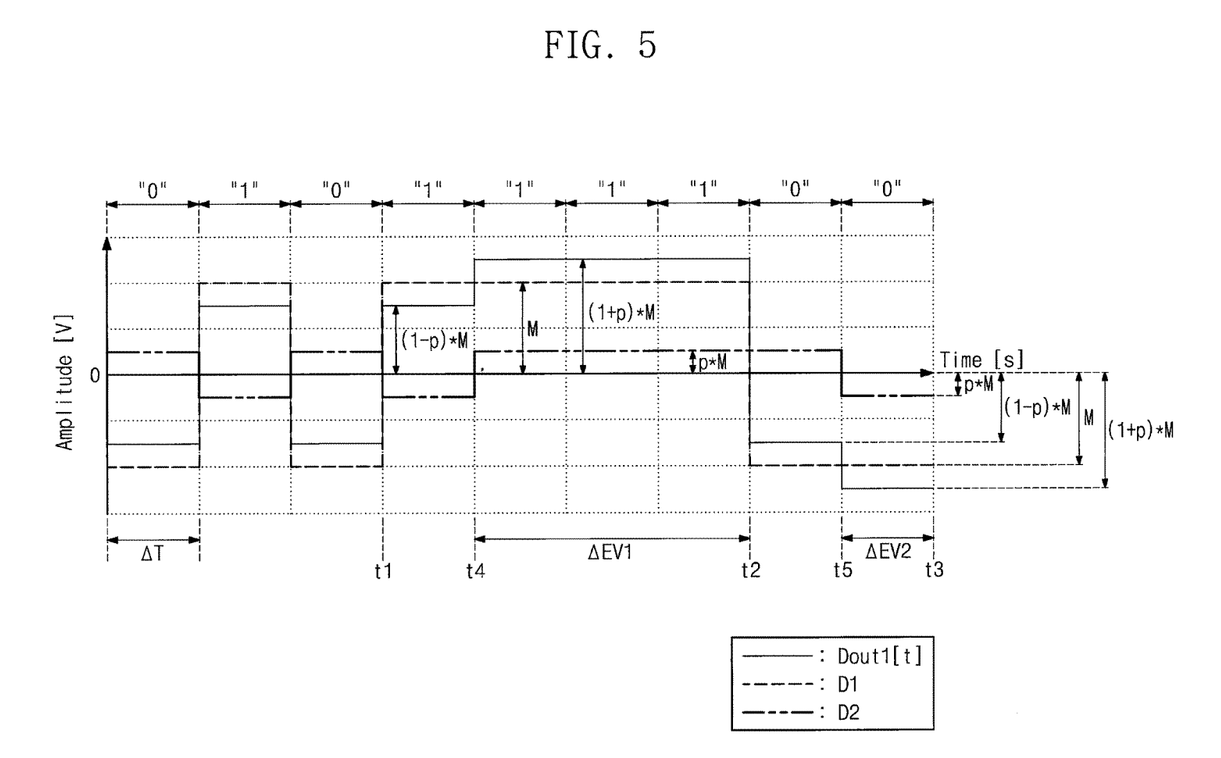
FIG. 5 is a graph illustrating signals generated or output by the emphasis signal generating circuit of FIG. 4.

FIG. 5 is a graph illustrating signals generated or output by an emphasis signal generating circuit of FIG. 4. In an example of FIG. 5, an x-axis represents a time of a [s] unit. A Y-axis represents amplitudes of signals of a [V] unit. The signal Dout1[t] of FIG. 5 may be the signal Dout1[t] of FIG. 4. The signal D1 of FIG. 5 may be the signal D1 of FIG. 4. The signal D2 of FIG. 5 may be the signal D2 of FIG. 4. As described with reference to FIG. 1, the time ΔT may be substantially the same as a clock period. However, the inventive concepts may be practiced in all embodiments associated with any time ΔT. An exemplary method for determining the time ΔT will be described.

As described with reference to FIG. 2, the signal Dout1[t] may indicate data for each interval corresponding to the time ΔT. For example, between a time t1 and a time t2, the signal Dout1[t] may indicate data "1111". Between the time t2 and a time t3, the signal Dout1[t] may indicate data "00".

As described with reference to FIG. 4, the output driver 310 may output substantially the same signal D1 as the signal Din[t]. Referring to FIGS. 2 and 5, the waveform of the signal D1 may be substantially the same as the waveform of the signal Din[t]. The driver strength control circuit 330 may output the signal Din[t−ΔT] amplified by "p" times as the signal D2(p*Din[t−ΔT]). For convenience of description, the example case where "p=0.25" is illustrated in FIG. 5. However, the present disclosure is not limited thereto. For example, the inventive concepts may be practiced in all embodiments corresponding to a positive number "p".

The adder circuit 340 of FIG. 4 may add the signal D1 and the signal D2 to output the signal Dout1[t]. Accordingly, the amplitude of the signal Dout1[t] may correspond to a value that is obtained by adding the amplitude of the signal D1 and the amplitude of the signal D2.

In the case where the amplitude of the signal Din[t] of FIG. 4 is "M", since the signal D1 is substantially the same as the signal Din[t], the amplitude of the signal D1 may be "M" in a time domain illustrated in the graph. Since the signal Din[t−ΔT] is generated by delaying the signal Din[t] of FIG. 4, the amplitude of the signal Din[t−ΔT] may be substantially the same as the amplitude of the signal Din[t]. Accordingly, the amplitude of the signal Din[t−ΔT] may be "M". Since the signal D2 is generated by amplifying the signal Din[t−ΔT] by "p" times, the amplitude of the signal D2 may be "p*M". The amplitude of the signal D2 may be smaller than "M".

Since the signal Dout1[t] is generated by adding the signal D1 and the signal D2, in a first emphasis interval ΔEV1 between a time t4 and a time t2, the amplitude of the signal Dout1[t] may increase to "(1+p)*M". In a second emphasis interval ΔEV2 between a time t5 and a time t3, the amplitude of the signal Dout1[t] may increase to "(1+p)*M". That is, in the first emphasis interval ΔEV1 and the second emphasis interval ΔEV2, the amplitude of the signal Dout1[t] may correspond to a value that is obtained by adding the amplitude of the signal D1 and the amplitude of the signal D2.

In an interval between the time t1 and the time t4, which corresponds to the remaining portion of a low frequency interval between time t1 and time t2 other than the first emphasis interval ΔEV1, the amplitude of the signal Dout1[t] may decrease to "(1−p)*M". In an interval between the time t2 and the time t5, which corresponds to the remaining portion of a low frequency interval between time t2 and time t3 other than the second emphasis interval ΔEV2, the amplitude of the signal Dout1[t] may decrease to "(1−p)*M". In an interval before the time t1 (which, as discussed with reference to FIG. 1, may be a high frequency interval), the amplitude of the signal Dout1[t] may decrease to "(1−p)*M". That is, in the remaining intervals other than the first emphasis interval ΔEV1 and the second emphasis interval ΔEV2, the amplitude of the signal Dout1[t] may correspond to a value that is obtained by subtracting the amplitude of the signal D2 from the amplitude of the signal D1. Alternatively, in the remaining intervals other than the first emphasis interval ΔEV1 and the second emphasis interval ΔEV2, the amplitude of the signal Dout1[t] may correspond to a value that is obtained by subtracting the amplitude "p*M" of the signal D2 from the amplitude "M" of the signal Din[t].

The amplitude of the signal Dout1[t] may be determined according to the amplitude "p*M" of the signal D2. For example, in the first emphasis interval ΔEV1 and the second emphasis interval ΔEV2, the amplitude of the signal D1 may increase as much as the amplitude "p*M" of the signal D2. In the remaining intervals other than the first emphasis interval ΔEV1 and the second emphasis interval ΔEV2, the amplitude of the signal Dout1[t] may decrease as much as the amplitude "p*M" of the signal D2. The adder circuit 340 may output the signal Dout1[t] to the channel 120 of FIG. 1.

The signal D2 may include an emphasis component. An amplitude of the emphasis component may correspond to the amplitude "p*M" of the signal D2. The gain "p" of the driver strength control circuit 330 may be an emphasis constant. The amplitude "p*M" of the emphasis component may be proportional to each of the emphasis constant "p" and the amplitude "M" of the signal D1. Accordingly, as the gain of the driver strength control circuit 330 becomes greater, that is, as the emphasis constant "p" becomes greater, the amplitude of the emphasis component included in the signal D2 and the amplitude of the signal D2 may also become greater. For example, as "p" becomes greater, the amplitude "p*M" of the signal D2 may become greater. If the amplitude "p*M" of the signal D2 becomes greater, the amplitude of the signal Dout1[t] may greatly change between the time t1 and the time t3.

For example, as the emphasis constant "p" becomes greater, that is, as the amplitude "p*M" of the signal D2 becomes greater, the amplitude "1−p" of the signal Dout1[t] between the time t1 and the time t4 may become smaller, and the amplitude "1+p" of the signal Dout1[t] between the time t4 and the time t2 may become greater. Accordingly, at the time t4, the amplitude of the signal Dout1[t] may greatly change.

For example, as the emphasis constant "p" becomes greater, that is, as the amplitude "p*M" of the signal D2 becomes greater, the amplitude "1−p" of the signal Dout1[t] between the time t2 and the time t5 may become smaller, and the amplitude "1+p" of the signal Dout1[t] between the time t4 and the time t2 may become greater. Accordingly, at the time t5, the amplitude of the signal Dout1[t] may greatly change.

Accordingly, a designer may adjust the emphasis constant "p" to adjust the waveform of the signal Dout1[t]. For example, the designer may set the emphasis constant "p" great for the purpose of outputting the signal Dout1[t] including an emphasis component of a great amplitude. Alternatively, the designer may set the emphasis constant "p" small for the purpose of outputting the signal Dout1[t] including an emphasis component of a small amplitude.

The signal Dout1[t] may indicate unit data (e.g., 1-bit data) for each interval corresponding to the time ΔT. In an interval between the time t1 and the time t2 as a low frequency interval, the signal Dout1[t] may indicate data "1111". That is, in the interval between the time t1 and the time t2, data that the signal Dout1[t] indicates may be equally maintained with "1". In an interval between the time t2 and the time t3 as a low frequency interval, the signal Dout1[t] may indicate data "00". That is, in the interval between the time t2 and the time t3, data that the signal Dout1[t] indicates may be equally maintained with "0".

In the interval between the time t1 and the time t2, even though data that the signal Dout1[t] indicates are equally maintained with "1", the amplitude of the signal Dout1[t] may change. Since "p" is a positive number, as the amplitude "(1+p)*M" of the signal Dout1[t] between the time t4 and the time t2 may be greater than the amplitude "(1−p)*M" of the signal Dout1[t] between the time t1 and the time t4. The signal Dout1[t] may include an emphasis component by the signal D2 between the time t4 and a time t2.

In the interval between the time t2 and the time t3, even though data that the signal Dout1[t] indicates are equally maintained with "0", the amplitude of the signal Dout1[t] may change. The amplitude "(1+p)*M" of the signal Dout1[t] between the time t5 and the time t3 may be greater than the amplitude "(1−p)*M" of the signal Dout1[t] between the time t2 and the time t5. The signal Dout1[t] may include an emphasis component by the signal D2 between the time t5 and a time t3.

In the first emphasis interval ΔEV1 and the second emphasis interval ΔEV2, the amplitude "(1+p)*M" of the signal Dout1[t] may be greater than the amplitude "M" of the signal Din[t]. In a portion corresponding to the remaining interval of the low frequency interval between the time t1 and the time t2 other than the first emphasis interval ΔEV1, that is, in the interval between the time t1 and the time t4, the amplitude "(1−p)*M" of the signal Dout1[t] may be smaller than the amplitude "M" of the signal Din[t]. In a portion corresponding to the remaining interval of a low frequency interval between the time t2 and the time t3 other than the second emphasis interval ΔEV2, that is, in the interval between the time t2 and the time t5, the amplitude "(1−p)*M" of the signal Dout1[t] may be smaller than the amplitude "M" of the signal Din[t].

Since the emphasis component is based on the signal D2 and the signal D2 is based on the time ΔT (i.e., since D2=p*Din[t−ΔT]), a time point when the first emphasis interval ΔEV1 and the second emphasis interval ΔEV2 arrive may be determined based on the time ΔT. That is, as the time ΔT becomes greater, the first emphasis interval ΔEV1 and the second emphasis interval ΔEV2 may arrive late. Accordingly, the designer may adjust the time ΔT to adjust a time point when the first emphasis interval ΔEV1 and the second emphasis interval ΔEV2 arrive.

For example, referring to FIGS. 2 and 5 together, the designer may adjust the time ΔT in consideration of a period where interference is generated by the reflected wave. The designer may be able to predict that interference may be generated by the reflected wave in a low frequency interval (the interval between the time t1 and the time t2 and the interval between the time t2 and the time t3). Accordingly, the designer may adjust the time ΔT such that the first emphasis interval ΔEV1 is included in the interval between the time t1 and the time t2 as a low frequency interval and the second emphasis interval ΔEV2 is included in the interval between the time t2 and the time t3 as a low frequency interval.

Figure 6:
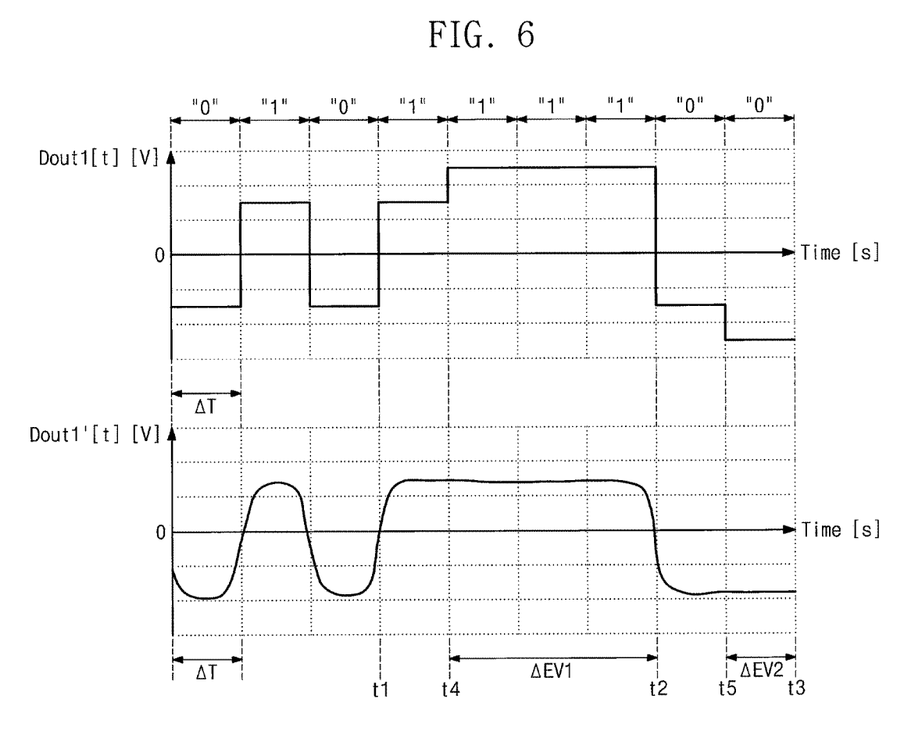
FIG. 6 is a graph illustrating signals that are output by the emphasis signal generating circuit of FIG. 4 and are received by a dual in-line memory module (DIMM).

FIG. 6 is a graph illustrating signals that are output by an emphasis signal generating circuit of FIG. 4 and are received by a DIMM. In an example of FIG. 6, an x-axis represents a time of a [s] unit. A Y-axis represents amplitudes of signals of a [V] unit. The signal Dout1[t] of FIG. 6 may be the signal Dout1[t] of FIG. 4.

The processor 110 of FIG. 1 may output the signal Dout1[t] to the channel 120. One DIMM of the first DIMM 130_1 to the n-th DIMM 130_n may receive the signal Dout1'[t] corresponding to the signal Dout1[t] from the channel 120.

As described with reference to FIG. 5, the amplitude of the signal Dout1[t] in a first emphasis interval ΔEV1 may be greater than the amplitude of the signal Dout1[t] between the time t1 and the time t4. Accordingly, in a case where the processor 110 of FIG. 1 transmits the signal Dout1[t], in the first emphasis interval ΔEV1, an emphasis component included in the signal Dout1[t] may be offset by the reflected wave. Accordingly, referring to FIGS. 2 and 6, in the first emphasis interval ΔEV1, the waveform of the signal Dout1'[t] may be distorted to be smaller than the waveform of the signal Din'[t].

In the first emphasis interval ΔEV1, data that the signal Dout1'[t] indicates and data that the signal Dout1[t] indicates may both be "111". Accordingly, between the time t1 and the time t2, data that the signal Dout1'[t] indicates and data that the signal Dout1[t] indicates may be equally maintained with "1111".

As described with reference to FIG. 2, between the time t1 and the time t2, data that the signal Dout1'[t] indicates may be different from data that the signal Din[t] indicates. Referring to FIGS. 2 and 6 together, between the time t1 and the time t2, the signal Dout1'[t] of FIG. 6 may indicate more exact or correct data than the signal Din'[t] of FIG. 2. Accordingly, the DIMM may obtain exact or correct data from the signal Dout1'[t] of FIG. 6.

The amplitude of the signal Dout1[*t*] in a second emphasis interval ΔEV2 may be greater than the amplitude of the signal Dout1[*t*] between the time t2 and the time t5. Accordingly, in a case where the processor 110 of FIG. 1 transmits the signal Dout1[*t*], in the second emphasis interval ΔEV2, an emphasis component included in the signal Dout1[*t*] may be offset by the reflected wave. Accordingly, referring to FIGS. 2 and 6 together, in the second emphasis interval ΔEV2, the waveform of the signal Dout1'[*t*] may be distorted to be smaller than the waveform of the signal Din'[t].

In the second emphasis interval ΔEV2, data that the signal Dout1'[*t*] indicates and data that the signal Dout1[*t*] indicates may be maintained during the interval with "0". Accordingly, between the time t2 and the time t3, data that the signal Dout1'[*t*] indicates and data that the signal Dout1[*t*] indicates may be maintained during the interval with "00".

As described with reference to FIG. 2, between the time t2 and the time t3, data that the signal Din'[t] indicates may be different from data that the signal Din[t] indicates. Referring to FIGS. 2 and 6 together, between the time t2 and the time t3, the signal Dout1'[*t*] of FIG. 6 may indicate more exact or correct data than the signal Din'[t] of FIG. 2. Accordingly, the DIMM may obtain exact or correct data from the signal Dout1'[*t*] of FIG. 6.

Figure 7:
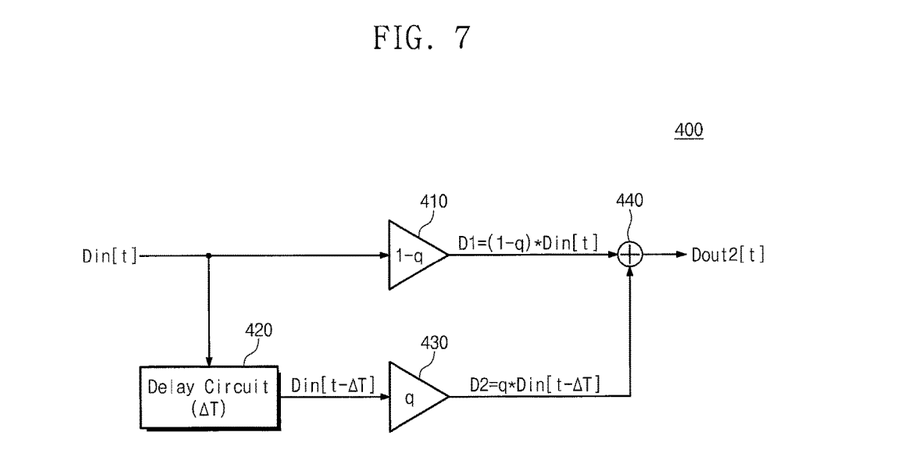
FIG. 7 is a block diagram illustrating an emphasis signal generating circuit according to aspects of the present disclosure.

FIG. 7 is a block diagram illustrating an emphasis signal generating circuit according to aspects of the present disclosure. The emphasis signal generating circuit 200 of FIG. 3 may include an emphasis signal generating circuit 400 of FIG. 7. An operation of a delay circuit 420 is similar to the operation of the delay circuit 220 of FIG. 3, and thus, a description thereof will not be repeated here.

An output driver 410 may receive the signal Din[t]. The output driver 410 may output a signal D1 based on the signal Din[t]. In the example of FIG. 7, the output driver 410 may amplify the amplitude of the signal Din[t] by "1−q" times. Here, "q" may be greater than "0" and may be smaller than "1". The output driver 410 may output the signal D1 to an adder circuit 440.

A driver strength control circuit 430 may receive the delayed signal Din[t−ΔT] from the delay circuit 420. The driver strength control circuit 430 may output a signal D2 based on the signal Din[t−ΔT]. For example, a gain of the driver strength control circuit 430 may be "q". The signal D2 may be a signal "q*Din[t−ΔT]" that is obtained by amplifying the signal Din[t−ΔT] by "q" times. The driver strength control circuit 430 may output the signal D2 to the adder circuit 440.

The adder circuit 440 may receive the signal D1 from the output driver 410. The adder circuit 440 may receive the signal D2 from the driver strength control circuit 430. The adder circuit 440 may add the signal D1 and the signal D2 to output a signal Dout2[*t*]. The signal Dout2[*t*] may be expressed by the following equation 3.

$$Dout2[t]=(1-q)*Din[t]+q*Din[t-\Delta T] \quad (3)$$

The processor 110 of FIG. 1 may output the signal Dout2[*t*] to the channel 120 instead of the signal Din[t]. Each of components of an electronic device (e.g., the electronic device 1000 of FIG. 10) may output the signal Dout2[*t*] for transmitting information.

Figure 8:
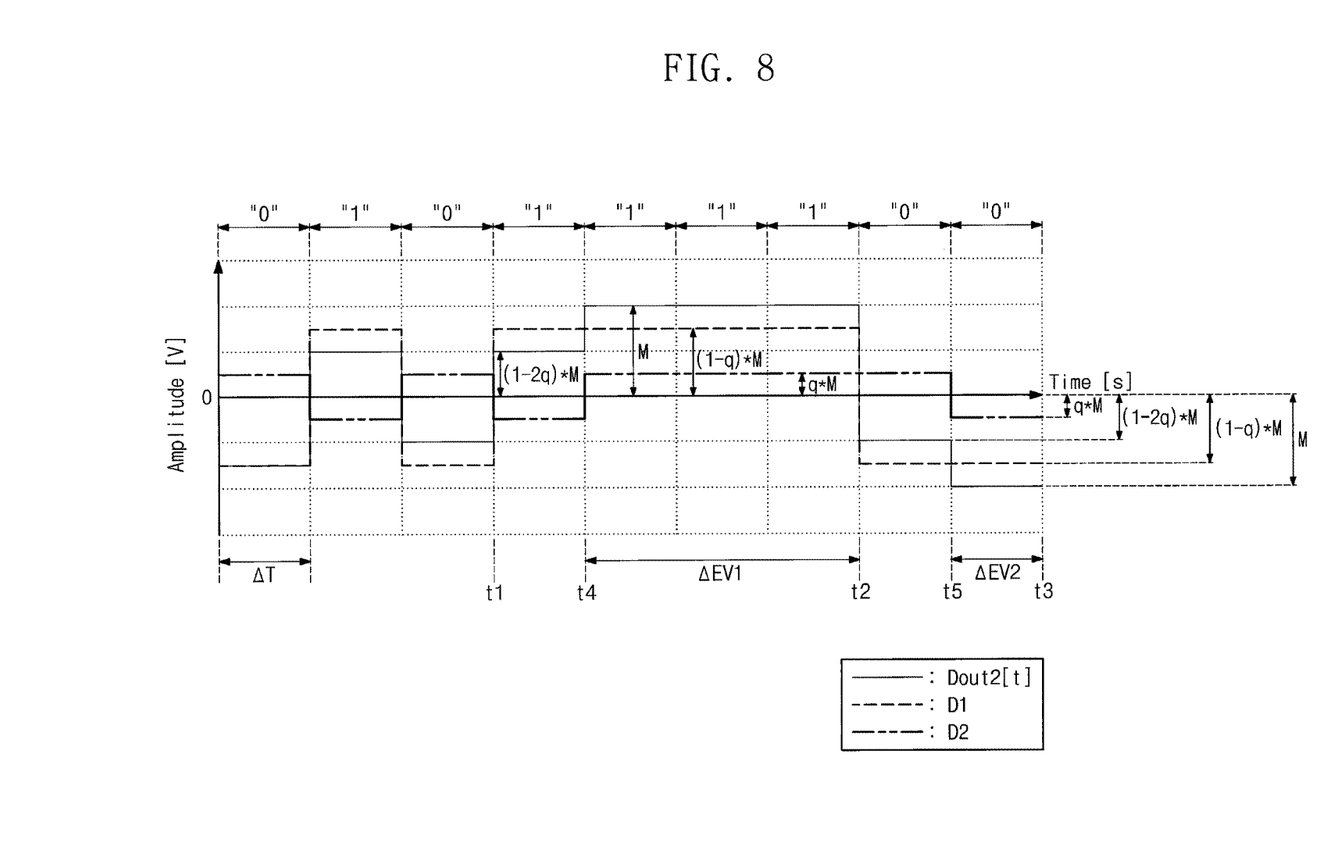
FIG. 8 is a graph illustrating signals generated or output by the emphasis signal generating circuit of FIG. 7.

FIG. 8 is a graph illustrating signals generated or output by the emphasis signal generating circuit 400 of FIG. 7. In an example of FIG. 8, an x-axis represents a time of a [s] unit. A Y-axis represents amplitudes of signals of a [V] unit. The signal Dout2[*t*] of FIG. 8 may be the signal Dout2[*t*] of FIG. 7. The signal D1 of FIG. 8 may be the signal D1 of FIG. 7. The signal D2 of FIG. 8 may be the signal D2 of FIG. 7.

As described with reference to FIG. 1, the time ΔT of FIG. 8 may be substantially the same as a clock period. However, the inventive concepts may include all embodiments associated with any time ΔT. An example method of determining the time ΔT will be described.

As described with reference to FIG. 2, the signal Dout2[*t*] may indicate data for each interval corresponding to the time ΔT. For example, between a time t1 and a time t2, the signal Dout2[*t*] may indicate data "1111". In an interval between the time t2 and a time t3, the signal Dout2[*t*] may indicate data "00".

As described with reference to FIG. 7, the output driver 410 may output the signal Din[t] amplified by "1−q" times as the signal D1((1−q)*Din[t]). The driver strength control circuit 430 may output the signal Din[t−ΔT] amplified by "q" times as the signal D2(q*Din[t−ΔT]). As described with reference to FIG. 7, "q" may be greater than "0" and may be smaller than "1". For convenience of description, the example case where "q=0.25" is illustrated in FIG. 8. However, the present disclosure is not limited thereto. For example, the inventive concepts may include all embodiments corresponding to all "q" greater than "0" and smaller than "1."

The adder circuit 440 of FIG. 7 may add the signal D1 and the signal D2 to output the signal Dout2[*t*]. Accordingly, the amplitude of the signal Dout2[*t*] may correspond to a value that is obtained by adding the amplitude of the signal D1 and the amplitude of the signal D2.

Referring to FIG. 7, the signal D1 may be generated by amplifying the signal Din[t] by "1−q" times. Accordingly, in the case where the amplitude of the signal Din[t] is "M", the amplitude of the signal D1 may be "(1−q)*M" in a time domain illustrated in the graph. Since the signal Din[t−ΔT] is generated by delaying the signal Din[t], the signal Din[t−ΔT] may have substantially the same amplitude as the signal Din[t]. Accordingly, the amplitude of the signal Din[t−ΔT] may be "M". Since the signal D2 is generated by amplifying the signal Din[t−ΔT] by "q" times, the amplitude of the signal D2 may be "q*M".

Since the signal Dout2[*t*] is generated by adding the signal D1 and the signal D2, in the first emphasis interval ΔEV1, the amplitude of the signal Dout2[*t*] may be "M". In the second emphasis interval ΔEV2, the amplitude of the signal Dout2[*t*] may be "M". That is, in the first emphasis interval ΔEV1 and the second emphasis interval ΔEV2, the amplitude of the signal Dout2[*t*] may be "M" corresponding to the amplitude of the signal Din[t] of FIG. 7.

In an interval between the time t1 and the time t4 as a low frequency interval, the amplitude of the signal Dout2[*t*] may be "(1−2q)*M". In an interval between the time t2 and the time t5 as a low frequency interval, the amplitude of the signal Dout2[*t*] may be "(1−2q)*M". In an interval before the time t1 as a high frequency interval, the amplitude of the signal Dout2[*t*] may be "(1−2q)*M". That is, in the remaining intervals other than the first emphasis interval ΔEV1 and the second emphasis interval ΔEV2, the amplitude of the signal Dout2[*t*] may correspond to a value that is obtained by subtracting the amplitude of the signal D2 from the amplitude of the signal D1. Alternatively, in the remaining intervals other than the first emphasis interval ΔEV1 and the second emphasis interval ΔEV2, the amplitude of the signal Dout2[*t*] may correspond to a value that is obtained by subtracting two times the amplitude of the signal D2 from the amplitude of the signal Din[t].

The amplitude of the signal Dout2[*t*] may be determined according to the amplitude "q*M" of the signal D2. For example, in the first emphasis interval ΔEV1 and the second emphasis interval ΔEV2, the amplitude of the signal D1 may increase as much as the amplitude "q*M" of the signal D2. In the remaining intervals other than the first emphasis interval ΔEV1 and the second emphasis interval ΔEV2, the amplitude of the signal D1 may decrease as much as the amplitude "q*M" of the signal D2. The adder circuit 440 may output the signal Dout2[$t$] to the channel 120 of FIG. 1.

The signal D2 may include an emphasis component. An amplitude of the emphasis component may correspond to the amplitude "q*M" of the signal D2. The gain of the driver strength control circuit 430, that is, "q" may be an emphasis constant. The amplitude "q*M" of the emphasis component may be proportional to each of the emphasis constant "q" and the amplitude "M" of the signal D1. As the gain of the driver strength control circuit 430 becomes greater, that is, as the emphasis constant "q" becomes greater, the amplitude "q*M" of the signal D2 may also become greater. As the amplitude "q*M" of the signal D2 becomes greater, the amplitude of the signal Dout2[$t$] may greatly change between the time t1 and the time t3.

For example, as the emphasis constant "q" becomes greater, that is, as the amplitude "q*M" of the signal D2 becomes greater, the amplitude "1–2q" of the signal Dout2[$t$] between the time t1 and the time t4 may become smaller. Accordingly, at the time t4, the amplitude of the signal Dout2[$t$] may greatly change.

For example, as "q" becomes greater, that is, as the amplitude "q*M" of the signal D2 becomes greater, the amplitude "1–2q" of the signal Dout2[$t$] between the time t2 and the time t5 may become smaller. Accordingly, at the time t5, the amplitude of the signal Dout2[$t$] may greatly change.

Accordingly, a designer may adjust the emphasis constant "q" to adjust the waveform of the signal Dout2[$t$]. For example, the designer may set the emphasis constant "q" great for the purpose of outputting the signal Dout2[$t$] including a lot of emphasis component. Alternatively, the designer may set the emphasis constant "q" small for the purpose of outputting the signal Dout2[$t$] including a few emphasis component.

The signal Dout2[$t$] may indicate unit data (e.g., 1-bit data) for each interval corresponding to the time ΔT. Between the time t1 and the time t2, the signal Dout2[$t$] may indicate data "1111". That is, between the time t1 and the time t2, data that the signal Dout2[$t$] indicates may be maintained with "1". Between the time t2 and a time t3, the signal Dout2[$t$] may indicate data "00". That is, in the interval between the time t2 and the time t3, data that the signal Dout2[$t$] indicates may be maintained with "0".

In the interval between the time t1 and the time t2, even though data that the signal Dout2[$t$] indicates are maintained with "1", the amplitude of the signal Dout2[$t$] may change. The amplitude "M" of the signal Dout2[$t$] in the first emphasis interval ΔEV1 may be greater than the amplitude "(1–2q)*M" of the signal Dout2[$t$] between the time t1 and the time t4. In the first emphasis interval ΔEV1, the signal Dout2[$t$] may include an emphasis component by the signal D2.

In the interval between the time t2 and the time t3, even though data that the signal Dout2[$t$] indicates are maintained with "0", the amplitude of the signal Dout2[$t$] may change. The amplitude "M" of the signal Dout2[$t$] in the second emphasis interval ΔEV2 may be greater than the amplitude "(1–2q)*M" of the signal Dout2[$t$] between the time t2 and the time t5. In the second emphasis interval ΔEV2, the signal Dout2[$t$] may include an emphasis component by the signal D2.

In the first emphasis interval ΔEV1 and the second emphasis interval ΔEV2, the amplitude of the signal Dout2[$t$] may correspond to the amplitude of the signal Din[t] of FIG. 7. For example, the amplitude of the signal Dout2[$t$] may be substantially the same as the amplitude "M" of the signal Din[t] of FIG. 7. In an interval, which corresponds to the remaining portion of a low frequency interval between the time t1 and the time t2 other than the first emphasis interval ΔEV1, that is, in the interval between the time t1 and the time t4, the amplitude "(1–2q)*M" of the signal Dout2[$t$] may be smaller than the amplitude "M" of the signal Din[t]. In an interval, which corresponds to the remaining portion of a low frequency interval between the time t2 and the time t3 other than the second emphasis interval ΔEV2, that is, in the interval between the time t2 and the time t5, the amplitude "(1–2q)*M" of the signal Dout2[$t$] may be smaller than the amplitude "M" of the signal Din[t].

Since the emphasis component is based on the signal D2 and the signal D2 is based on the time ΔT (i.e., since D2=q*Din[t–ΔT]), the first emphasis interval ΔEV1 and the second emphasis interval ΔEV2 may be determined based on the time ΔT. That is, as the time ΔT becomes greater, the first emphasis interval ΔEV1 and the second emphasis interval ΔEV2 may arrive late.

Figure 9:
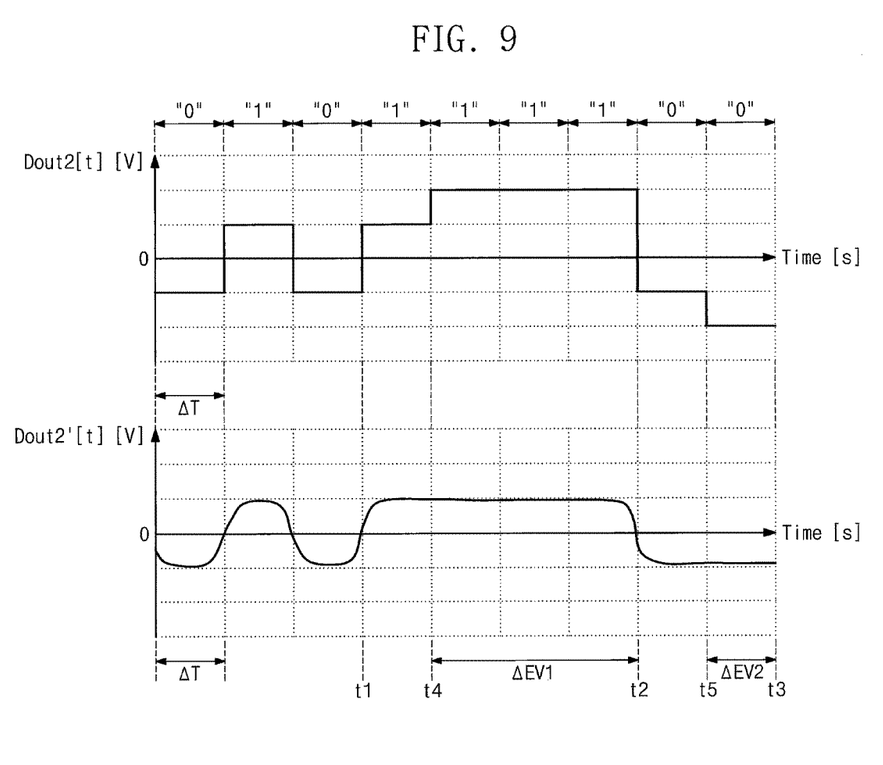
FIG. 9 is a graph illustrating signals that are output by the emphasis signal generating circuit of FIG. 7 and are received by the DIMM.

FIG. 9 is a graph illustrating signals that are output by an emphasis signal generating circuit of FIG. 7 and are received by a DIMM. In an example of FIG. 9, an x-axis represents a time of a [s] unit. A Y-axis represents amplitudes of signals of a [V] unit. The signal Dout2[$t$] of FIG. 9 may be the signal Dout2[$t$] of FIG. 8.

The processor 110 of FIG. 1 may output the signal Dout2[$t$] to the channel 120. One DIMM of the first DIMM 130_1 to the n-th DIMM 130_n may receive the signal Dout2'[$t$] corresponding to the signal Dout2[$t$] from the channel 120.

As described with reference to FIG. 8, the amplitude "M" of the signal Dout2[$t$] in the first emphasis interval ΔEV1 may be greater than the amplitude "(1–2q)*M" of the signal Dout2[$t$] between the time t1 and the time t4. In the case where the processor 110 of FIG. 1 transmits the signal Dout2[$t$], in the first emphasis interval ΔEV1, an emphasis component included in the signal Dout2[$t$] may be offset by the reflected wave. Accordingly, referring to FIGS. 2 and 9 together, in the first emphasis interval ΔEV1, the waveform of the signal Dout2'[$t$] may be distorted to be smaller than the waveform of the signal Din'[t].

In the first emphasis interval ΔEV1, data that the signal Dout2'[$t$] indicates and data that the signal Dout2[$t$] indicates may be equally maintained with "111". Accordingly, between the time t1 and the time t2, data that the signal Dout2'[$t$] indicates and data that the signal Dout2[$t$] indicates may be equally maintained with "1111".

As described with reference to FIG. 2, between the time t1 and the time t2, data that the signal Din'[t] indicates may be different from data that the signal Din[t] indicates. Referring to FIGS. 2 and 9 together, between the time t1 and the time t2, the signal Dout2'[$t$] of FIG. 9 may indicate more exact or correct data than the signal Din'[t] of FIG. 2. Accordingly, the DIMM may obtain exact or correct data from the signal Dout2'[$t$] of FIG. 9.

The amplitude "M" of the signal Dout2[$t$] in the second emphasis interval ΔEV2 may be greater than the amplitude "(1–2q)*M" of the signal Dout2[$t$] between the time t2 and the time t5. In the case where the processor 110 of FIG. 1 transmits the signal Dout2[$t$], in the second emphasis interval ΔEV2, an emphasis component included in the signal Dout2[$t$] may be offset by the reflected wave. Accordingly, referring to FIGS. 2 and 9 together, in the second emphasis interval ΔEV2, the waveform of the signal Dout2'[t] may be distorted to be smaller than the waveform of the signal Din'[t].

In the second emphasis interval ΔEV2, data that the signal Dout2'[t] indicates and data that the signal Dout2[t] indicates may equally be "0". Accordingly, between the time t2 and the time t3, data that the signal Dout2'[t] indicates and data that the signal Dout2 [t] indicates may be equally maintained with "00".

As described with reference to FIG. 2, between the time t2 and the time t3, data that the signal Din'[t] indicates may be different from data that the signal Din[t] indicates. Referring to FIGS. 2 and 9 together, between the time t2 and the time t3, the signal Dout2'[t] of FIG. 9 may indicate more exact or correct data than the signal Din'[t] of FIG. 2. Accordingly, the DIMM may obtain exact or correct data from the signal Dout2'[t] of FIG. 9.

Referring to FIGS. 6 and 9 together, in a time domain illustrated in the graph, the maximum amplitude of the signal Dout1[t] may be greater than the maximum amplitude of the signal Dout2[t]. As described above, the signal Dout1[t] may be output by the emphasis signal generating circuit 300 of FIG. 4, and the signal Dout2[t] may be output by the emphasis signal generating circuit 400 of FIG. 7.

The maximum amplitude of a signal that the output driver 410 of FIG. 7 is able to output may be smaller than the maximum amplitude of a signal that the output driver 310 of FIG. 3 is able to output. Accordingly, a designer may design the emphasis signal generating circuit 300 of FIG. 4 upon designing an emphasis signal generating circuit comprising an output driver in which the maximum amplitude of a signal to be output is great. Also, the designer may design the emphasis signal generating circuit 400 of FIG. 7 upon designing an emphasis signal generating circuit comprising an output driver in which the maximum amplitude of a signal to be output is small.

Figure 10:
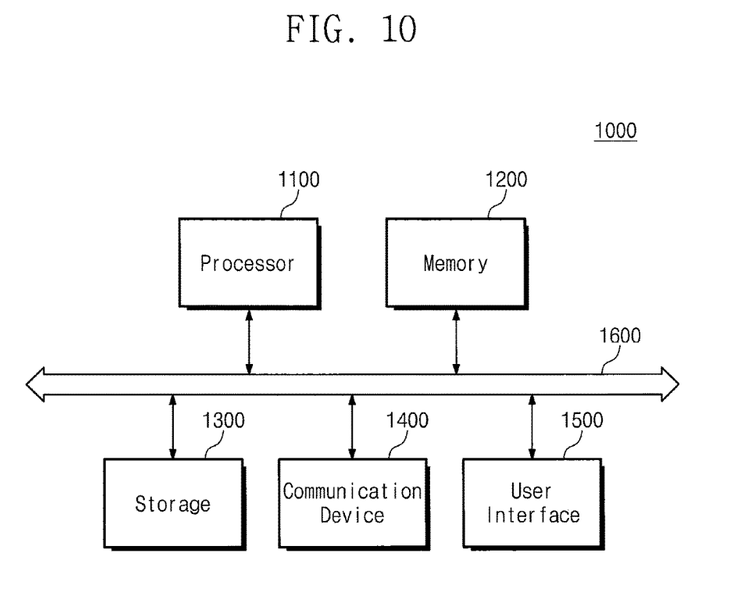
FIG. 10 is a block diagram illustrating an example of electronic device including the emphasis signal generating circuit of FIG. 3.

FIG. 10 is a block diagram illustrating an example of an electronic device that includes an emphasis signal generating circuit of FIG. 3.

For example, an electronic device 1000 may be a personal computer (PC), a workstation, a notebook computer, a tablet, or the like. Referring to FIG. 10, the electronic device 1000 may include a processor 1100, a memory 1200, storage 1300, a communication device 1400, a user interface 1500, and a bus 1600. The electronic device 1000 may further include other components (e.g., various sensors, a power supply, and the like) that are not illustrated in FIG. 10. Alternatively, the electronic device 1000 may not include one or more of components that are illustrated in FIG. 10.

The processor 1100 may control overall operations of the electronic device 1000. The processor 1100 may be a central control device that may process operations needed to operate the electronic device 1000. For example, the processor 1100 may process data for controlling operations of the electronic device 1000. The processor 1100 may include the processor 110 of FIG. 1. For example, the processor 1100 may be a general-purpose processor, a workstation processor, an application processor, or the like. The processor 1100 may include a single processor core or may include a plurality of processor cores. For example, the processor 1100 may include a multi-core such as a dual-core (two processor cores), a quad-core (four processor cores), a hexa-core (six processor cores), or may include some other number of cores.

The memory 1200 may store data processed or to be processed by the processor 1100. The memory 1200 may include one or more DIMMs. For example, the memory 1200 may include the first DIMM 130_1 to the n-th DIMM 130_n of FIG. 1. The one or more DIMMs may store or output data through communication with components of the electronic device 1000. For example, the memory 1200 may include a volatile memory such as a static random access memory (SRAM), a dynamic RAM (DRAM), a synchronous DRAM (SDRAM), or the like, or a nonvolatile memory such as a flash memory, a phase-change RAM (PRAM), a magneto-resistive RAM (MRAM), a resistive RAM (ReRAM), a ferroelectric RAM (FRAM), or the like. Alternatively, the memory 1200 may include heterogeneous memories.

The storage 1300 may store data regardless of power supply. For example, the storage 1300 may be a storage medium, which includes a nonvolatile memory, such as a hard disk drive (HDD), a solid state drive (SSD), a secure digital (SD) card, a universal serial bus (USB) memory device, or the like.

The communication device 1400 may include a transmitter unit and a receiver unit. The electronic device 1000 may communicate with another electronic device through the communication device 1400 to transmit and/or receive data.

The user interface 1500 may convey an input/output of a command or data between a user and the electronic device 1000. For example, the user interface 1500 may include a physical device such as an input device and/or an output device. The input device may include a keyboard, a mouse, a touchscreen, a scanner, a joystick, a voice recognition device, a motion recognition device, or an eyeball recognition device, and the output device may include a monitor, a display device, a projector, a speaker, or a plotter.

The bus 1600 may provide a communication path between the components of the electronic device 1000. The bus 1600 may include the channel 120 of FIG. 1. For example, the processor 1100, the memory 1200, the storage 1300, the communication device 1400, and the user interface 1500 may exchange data with each other through the bus 1600. The bus 1600 may be configured to support various types of communication formats used in the electronic device 1000.

Various components, including the processor 1100, the memory 1200, the storage 1300, the communication device 1400, and the user interface 1500 of FIG. 10 may include the emphasis signal generating circuit 200 of FIG. 3 for the purpose of transmitting a signal indicating data. For example, the processor 1100 may generate data for controlling operations of the electronic device 1000. The emphasis signal generating circuit 200 included in the processor 1100 may output a signal Dout[t] indicating data through the bus 1600. The memory 1200 may receive a signal corresponding to the signal Dout[t] through the bus 1600. The memory 1200 may obtain data processed by the processor 1100 based on the received signal. The memory 1200 may store the obtained data.

According to an embodiment, a waveform of a signal may be distorted in a process where components in an electronic device transmit the signal. Accordingly, the present disclosure provides that components in the electronic device may exactly or correctly exchange data with each other through usage of the devices and components described herein.

While the inventive concepts have been described with reference to example embodiments thereof, it will be apparent to those of ordinary skill in the art that various changes and modifications may be made thereto without departing from the scope of the inventive concepts as set forth in the following claims.

What is claimed is:

1. An electronic device comprising:
a driver configured to generate a second signal based on a first signal;
a delay circuit configured to delay the first signal by a reference time, to generate a third signal;
a strength control circuit configured to adjust an amplitude of the third signal to generate a fourth signal; and
an adder circuit configured to add the second signal and the fourth signal to generate a fifth signal,
wherein, in a first time interval determined based on the reference time, an amplitude of the fifth signal is greater than an amplitude of the second signal,
wherein, in a second time interval not overlapping with the first time interval, the amplitude of the fifth signal is smaller than the amplitude of the second signal, and
wherein, in the second time interval, the amplitude of the fifth signal is smaller than an amplitude of the first signal.

2. The electronic device of claim 1, wherein the driver, the delay circuit, the strength control circuit, and the adder circuit operate based on a clock, and
wherein the reference time is associated with a period of the clock.

3. The electronic device of claim 2, wherein the reference time corresponds to the period of the clock, and each of the first signal and the fifth signal indicates a data value for each period of the clock.

4. The electronic device of claim 3, wherein the first time interval is included in a low frequency interval in which values of data indicated by the first signal during two or more periods of the clock are a same binary value.

5. The electronic device of claim 4, wherein the reference time is determined such that the first time interval is included in the low frequency interval.

6. The electronic device of claim 1, wherein data values that the first signal indicates during a low frequency interval are a same binary value,
wherein data values that the fifth signal indicates are identical to the data values that the first signal indicates, and
wherein the first time interval is included in the low frequency interval.

7. The electronic device of claim 6, wherein the amplitude of the fifth signal in the first time interval is greater than the amplitude of the fifth signal in a third time interval included in the low frequency interval, wherein the third time interval is not overlapping with the first time interval.

8. The electronic device of claim 6, wherein, in the first time interval, the amplitude of the fifth signal is identical to the amplitude of the first signal.

9. The electronic device of claim 6, wherein, in the first time interval, the amplitude of the fifth signal is greater than the amplitude of the first signal.

10. The electronic device of claim 1, wherein the fourth signal includes an emphasis component that increases the amplitude of the second signal in the first time interval.

11. The electronic device of claim 10, wherein an amplitude of the emphasis component increases as a gain of the strength control circuit increases.

12. An electronic device comprising:
a driver configured to generate a second signal, an amplitude of which corresponds to an amplitude of a first signal;
a delay circuit configured to delay the first signal by a reference time, to generate a third signal;
a strength control circuit configured to generate a fourth signal including an emphasis component, wherein an amplitude of the emphasis component is determined based on an amplitude of the third signal; and
an adder circuit configured to add the second signal and the fourth signal to generate a fifth signal,
wherein, in a first time interval determined based on the reference time, an amplitude of the fifth signal is greater than the amplitude of the first signal, and
wherein, in a second time interval not overlapping with the first time interval, the amplitude of the fifth signal is smaller than the amplitude of the first signal.

13. The electronic device of claim 12, wherein the driver, the delay circuit, the strength control circuit, and the adder circuit operate based on a clock signal,
wherein the reference time corresponds to a period of the clock signal, and
wherein each of the first signal and the fifth signal indicates a data value for each period of the clock signal.

14. The electronic device of claim 13, wherein the data value of the fifth signal is identical to the data value of the first signal.

15. The electronic device of claim 12, wherein, in the first time interval, the amplitude of the fifth signal has a value obtained by adding the amplitude of the second signal and an amplitude of the fourth signal, and
wherein, in the second time interval, the amplitude of the fifth signal has a value obtained by subtracting the amplitude of the fourth signal from the amplitude of the second signal.

16. The electronic device of claim 12, wherein the first time interval is included in a low frequency interval, and
wherein data values indicated by the first signal during the low frequency interval have an equal binary value.

17. The electronic device of claim 16, wherein a time point indicating arrival of the first time interval is determined based on the reference time, and
wherein the reference time is determined such that the first time interval is included in the low frequency interval.

18. An electronic device comprising:
a driver configured to generate a second signal, an amplitude of which is smaller than an amplitude of a first signal;
a delay circuit configured to delay the first signal by a reference time, to generate a third signal;
a strength control circuit configured to generate a fourth signal including an emphasis component, an amplitude of which is determined based on an amplitude of the third signal; and
an adder circuit configured to add the second signal and the fourth signal to generate a fifth signal,
wherein, in a first time interval determined based on the reference time, an amplitude of the fifth signal corresponds to the amplitude of the first signal, and
wherein, in a second time interval not overlapping with the first time interval, the amplitude of the fifth signal is smaller than the amplitude of the first signal.

19. The electronic device of claim 18, wherein, in the second time interval, the amplitude of the fifth signal has a value obtained by subtracting two times an amplitude of the fourth signal from the amplitude of the first signal.

20. The electronic device of claim 18, wherein a data value that the fifth signal indicates is equal to the data value that the first signal indicates.

* * * * *